United States Patent
Ban

(10) Patent No.: US 7,478,027 B2
(45) Date of Patent: Jan. 13, 2009

(54) SYSTEMS, METHODS, AND MEDIA FOR SIMULATION OF INTEGRATED HARDWARE AND SOFTWARE DESIGNS

(75) Inventor: Oliver Keren Ban, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 482 days.

(21) Appl. No.: 11/094,397

(22) Filed: Mar. 30, 2005

(65) Prior Publication Data

US 2006/0224372 A1    Oct. 5, 2006

(51) Int. Cl.
G06F 17/50    (2006.01)
G06F 9/45    (2006.01)

(52) U.S. Cl. .............. 703/13; 703/16; 703/19; 716/1; 716/6; 716/7

(58) Field of Classification Search ............ 703/13, 703/16, 19; 716/1, 6, 7
See application file for complete search history.

(56) References Cited

U.S. PATENT DOCUMENTS

| | | | | |
|---|---|---|---|---|
| 5,678,028 | A | * | 10/1997 | Bershteyn et al. .......... 703/22 |
| 5,752,002 | A | * | 5/1998 | Naidu et al. .............. 703/14 |
| 5,768,567 | A | | 6/1998 | Klein et al. |
| 5,838,948 | A | | 11/1998 | Bunza |
| 6,006,022 | A | | 12/1999 | Rhim et al. |
| 6,052,524 | A | | 4/2000 | Pauna |
| 6,199,031 | B1 | | 3/2001 | Challier et al. |
| 6,202,044 | B1 | | 3/2001 | Tzori |
| 6,212,489 | B1 | | 4/2001 | Klein et al. |
| 6,230,114 | B1 | | 5/2001 | Hellestrand et al. |
| 6,263,302 | B1 | | 7/2001 | Hellestrand et al. |
| 6,317,706 | B1 | | 11/2001 | Saib |
| 6,356,862 | B2 | * | 3/2002 | Bailey ................... 703/16 |
| 6,470,481 | B2 | * | 10/2002 | Brouhard et al. .......... 716/5 |
| 6,490,545 | B1 | | 12/2002 | Peng |
| 6,539,522 | B1 | | 3/2003 | Devins et al. |
| 6,550,042 | B1 | | 4/2003 | Dave |
| 6,993,469 | B1 | * | 1/2006 | Bortfeld ................. 703/15 |

FOREIGN PATENT DOCUMENTS

JP    2001 101247 A    4/2001

* cited by examiner

Primary Examiner—Paul L Rodriguez
Assistant Examiner—Dwin M Craig
(74) Attorney, Agent, or Firm—Mark E. McBurney; Schubert Osterrieder & Nickelson PLLC

(57) ABSTRACT

Systems, methods and media for simulation of integrated hardware and software designs are disclosed. More particularly, hardware and/or software for synchronizing cycle timers of an integrated hardware and software design are disclosed. One embodiment provides a system for simulating an integrated design. Embodiments may include one or more software components each having a single cycle timer and one or more hardware components each having a single cycle timer. Embodiments may also include a cycle synchronizer in communication with the one or more software components and the one or more hardware components that is adapted to call once per cycle the single cycle timers of the one or more software components and the one or more hardware components. In a further embodiment, the cycle synchronizer may be further adapted to call the single cycle timers of the components on the falling edge of the cycle.

14 Claims, 4 Drawing Sheets

SYSTEMS, METHODS, AND MEDIA FOR SIMULATION OF INTEGRATED HARDWARE AND SOFTWARE DESIGNS

FIELD OF INVENTION

The present invention is in the field of electronic system simulation. More particularly, the present invention relates to systems, methods and media for simulating integrated hardware and software designs of a system, such as a system on a chip.

BACKGROUND

Electronic devices or systems are often designed with highly integrated hardware and software components to improve performance and reduce cost and size. Electronic systems typically have a variety of hardware components such as one or more central processing units (CPUs), static random access memory (SRAM) modules, dynamic random access memory (DRAM) modules, memory management units, caches, buses, modems, storage devices, or other components. Electronic systems also typically have a variety of software components such as application programs, operating systems, and device drivers that interact with the multiple hardware components to provide desired functionality. One electronic system is a system-on-a-chip (SoC) that holds all of the hardware and electronic circuitry for a complete system, including on-chip memory, the CPU, peripheral interfaces, I/O logic control, data converters, and other components to comprise a complete computer system.

Integrated electronic systems are becoming more and more ubiquitous in our daily lives, being used in products ranging from consumer devices such as digital cameras and cellular phones to computer systems, automobiles, communications systems, etc. As the use of integrated electronic systems becomes more widespread, there is increasing desire to improve the performance and reduce the size and cost of the designs. The design and verification process, however, can be very time-consuming and resource-intensive, as components from multiple manufacturers are typically integrated into one integrated system.

Designs of integrated electronic systems including both hardware and software are typically validated during the design so that problems are found before completion of the design and manufacture of a product, as redesigns become more expensive in time and resources as the design gets closer to manufacture. One particular difficulty in designing integrated electronic systems results from the simultaneous design of hardware and software systems. Due to increased time to market pressures, hardware and software are usually developed in parallel. The hardware design is validated using a hardware simulator or emulator while the software is validated using an instruction set simulator on a general purpose computer. The instruction set simulator must rely on simulations of the hardware performance as both designs are being performed simultaneously, resulting in difficulties in accurately integrating the software with the hardware. Integration of the hardware and software designs is made more difficult by the uncertainties of the other designs and because of the simultaneous design. Moreover, many components are off-the-shelf (OTS) designs and are thus more difficult to tightly integrate with other components.

The difficulties arising from integrating hardware and software designs during development are exacerbated by intellectual property (IP) ownership issues. In many cases, each component may be created by a different company which retains ownership to its design, making it more difficult to fully integrate the design between components. Further, each component has its own characteristics and is designed by different people who may spread across two or more companies. The distribution of knowledge about how each component is designed increases the complexity of integrating the components. The problem of IP ownership can be solved to a large extent by licensing or cross-licensing between companies, providing some integration flexibility. Companies may solve the problem of distributed expertise by broadening the architecture and design capacity of the company.

The interconnect between components is typically standardized and the interface devices are typically pre-made and ready to use OTS products, resulting in no standard definition of the internal bus architecture for internal links between blocks inside chips. The lack of a standard definition of interconnects between components makes simulation and validation more difficult, particularly when trying to synchronize timing cycles between hardware and software components. Previous solutions ran hardware and software emulation or simulation separately (in a process known as co-simulation), waiting until the hardware (i.e., chip) was ready to be put under a real testing environment and running the software under that environment. Such a solution results in loose integration at best and results in timing problems resulting from cycle synchronization issues.

There is, therefore, a need for an effective mechanism for improving simulation of integrated hardware and software systems. There is an even greater need for such a system when timing cycles of hardware and software components to be integrated or synchronized.

SUMMARY OF THE INVENTION

The problems identified above are in large part addressed by systems, methods and media for simulation of integrated hardware and software designs. One embodiment provides a system for simulating an integrated design. The system may generally include one or more software components each having a single cycle timer and one or more hardware components each having a single cycle timer. The system may also generally include a cycle synchronizer in communication with the one or more software components and the one or more hardware components that is adapted to call, once per cycle, the single cycle timers of the one or more software components and the one or more hardware components. Further embodiments may also include a memory model, a cycle monitor, or a cycle checker. The one or more software components may include a bus interface monitor or a communication protocol monitor, while the one or more hardware components may include a Digital Signal Processor model or a processor model. In some embodiments, the cycle synchronizer may be further adapted to call the single cycle timers of the components on the falling edge of the cycle.

Another embodiment provides a method for synchronizing a co-simulation system. Embodiments may generally include performing by a cycle synchronizer a clock cycle and, during the clock cycle, calling by the cycle synchronizer a clock cycle of a single cycle timer in a plurality of sub-modules. Embodiments may also include performing by the sub-modules operations relating the called cycle of the cycle synchronizer single cycle timer. Further embodiments may include calling by one or more of the sub-modules a clock cycle of a single cycle timer in a function block. Further embodiments may also include calling the clock cycle in the falling edge of the clock cycle of the cycle synchronizer. Another further embodiment may include calling the clock cycle of the single cycle timer in at least one software sub-module and at least one hardware sub-module.

Another embodiment provides a machine-accessible medium containing instructions effective, when executing in a data processing system, to cause the system to perform a series of operations for synchronizing a database on a network. The series of operations generally includes performing by a cycle synchronizer a clock cycle and, during the clock cycle, calling by the cycle synchronizer a clock cycle of a single cycle timer in a plurality of sub-modules. The series of operations may also include performing by the sub-modules operations relating the called cycle of the cycle synchronizer single cycle timer. Further embodiments may include calling by one or more of the sub-modules a clock cycle of a single cycle timer in a function block. Further embodiments may also include calling the clock cycle in the falling edge of the clock cycle of the cycle synchronizer. Another further embodiment may include calling the clock cycle of the single cycle timer in at least one software sub-module and at least one hardware sub-module.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Systems, methods and media for simulation of integrated hardware and software are disclosed. More particularly, hardware and/or software for synchronizing cycle timers of an integrated hardware and software design are disclosed. One embodiment provides a system for simulating an integrated design. Embodiments may include one or more software components each having a single cycle timer and one or more hardware components each having a single cycle timer. Embodiments may also include a cycle synchronizer in communication with the one or more software components and the one or more hardware components that is adapted to call once per cycle the single cycle timers of the one or more software components and the one or more hardware components. In a further embodiment, the cycle synchronizer may be further adapted to call the single cycle timers of the components on the falling edge of the cycle.

The disclosed embodiments provide a methodology and system for integrating and simulating an integrated hardware and software design. By utilizing a cycle synchronizer to synchronize the cycle clocks of different hardware and software components, the need for individual components to synchronize with each other may be advantageously avoided. Such a system eliminates the need for components to comply with standard protocols with complicated communication mechanisms that are hard to coordinate in a hardware and software co-simulation environment. This may drastically reduce the integrated system design complexity, reducing the size of the design and making it simpler to implement. Eliminating the need to go through standard protocols also may significantly increase the speed of information access.

While specific embodiments will be described below with reference to particular configurations of hardware and/or software, those of skill in the art will realize that embodiments of the present invention may advantageously be implemented with other substantially equivalent hardware and/or software systems.

Figure 1:
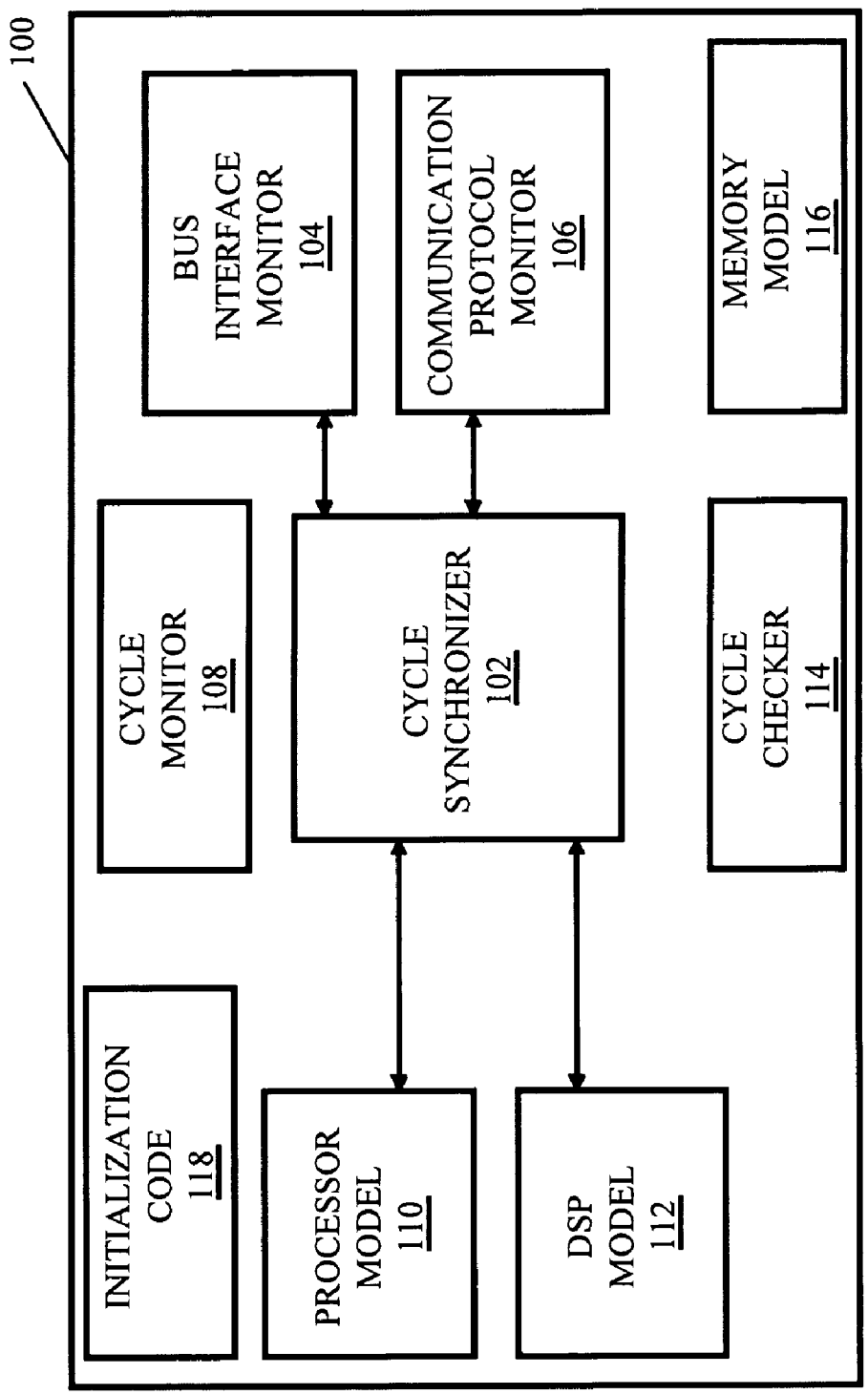
FIG. 1 depicts an environment for a system for co-simulating hardware and software components of an electronic system according to one embodiment.

Turning now to the drawings, FIG. 1 depicts an environment for a system for co-simulating hardware and software components of an electronic system according to one embodiment. In the depicted embodiment, the co-simulation system 100 includes one or more hardware blocks or components and one or more software blocks or components. An electronic system designer may use the co-simulation system 100 to simulate an integrated hardware and software design, including verifying the interface activity between hardware and software components. The co-simulation system 100 may include a cycle synchronizer 102, a bus interface monitor 104, a communication protocol monitor 106, a-cycle monitor 108, a processor model 110, a DSP model 112, a cycle checker 114, a memory model 116, and initialization code 118, or any other components. The electronic system being designed may be any integrated electronic system combining hardware and software, such as a SoC or other chip.

The co-simulation system 100 and any or all of its components may execute on a general or special purpose computer system such as one or more of a personal computer, workstation, server, mainframe computer, notebook or laptop computer, tablet PC, desktop computer, portable computer system, PDA, set-top box, mobile phone, wireless device, or the like. The computer system may, in one embodiment, include a central processing unit (CPU) and associated volatile and non-volatile memory, including random access memory (RAM) and basic input/output system read only memory (BIOS ROM), a system monitor, a keyboard, one or more flexible diskette drives, a CD-ROM drive, a fixed disk storage drive (also known as a "hard drive" or "hard disk drive"), a pointing device such as a mouse, and an optional network interface adapter, all electrically connected using a motherboard or system planar to electrically connect these components together. In one embodiment, the computer system may be an International Business Machine Corporation (IBM®) eServer or similar server having one or more processors, or threads of processors, executing software and/or one or more state machines coupled with data storage devices such as RAM, read only memory (ROM), flash memory, compact disk drives, hard drives, and the like.

The cycle synchronizer 102 may be embedded in the co-simulation system 100 to provide an integrated timing solution for the co-simulation system 100. The cycle synchronizer 102 may include a single cycle timer or cycle-time register to generate cycles used to simulate clock cycles of the co-simulation system 100. The cycle synchronizer 102 may serve as a top module of a hierarchy with components such as hardware models and software code underneath. By serving as a top module or 'root', the cycle synchronizer 102 may drive the cycles for any components beneath it in the hierarchy, as described in more detail subsequently.

The cycle synchronizer 102 may be in communication with a bus interface monitor 104, a communication protocol monitor 106, or other software components or modules for monitoring or checking the design of the electronic system, including the interface activity of the electronic system. The bus interface monitor 104 (also known as a checker) may monitor the traffic on a bus interface, including the content of information being transmitted or received on the bus. The communications protocol monitor 106 may monitor the operation and/or functionality of the communications protocol. As described subsequently, the bus interface monitor 104 and communication protocol monitor 106 may have its own single cycle timer that may be driven by the cycle synchronizer 102. Other software modules may also be included in the co-simulation system 100.

The cycle monitor 108 and cycle checker 114 may serve to manage and monitor the simulation and verification of the co-simulation system 100, including interface activity of the electronic system design. The cycle monitor 108 may observe chip activity and may handle scheduling of different tests of the electronic system interface. In one example, the cycle monitor 108 may test different corner cases and monitor the reaction in the bus to determine if the reaction was the expected one. The cycle checker 114 may verify the performance of a chip by analyzing the results of the test cases gathered by the cycle monitor 108.

The co-simulation system 100 may also include hardware models such as a processor model 110 and DSP model 112 in communication with the cycle synchronizer 102. The processor model 110 may model processors such as OTS processors for embedded systems. A multi-processor integrated design may include multiple processor models 110. The Digital Signal Processor (DSP) model 112 may model high-speed on-chip memory that may pull data from independent memory banks to improve processing bandwidth. Other hardware models may also be in communication with the cycle synchronizer 102.

The memory model 116 of the co-simulation system 100 may model memory of various types, such as memory models for dynamic RAM (DRAM), static RAM (SRAM), registers, and First-In First-Outs (FIFOs). The memory model 116 may be in communication with any of the other components of the co-simulation system 100 to facilitate the modeling and simulation of the various hardware and software components. The initialization code 118 schematically represents the software code used to initialize and simulate the integrated electronic system with the co-simulation system 100. The initialization code 118 may instantiate any of the hardware or software models.

The co-simulation system 100 may provide an effective solution for synchronizing the clock cycles of different components of an integrated hardware and software design. The cycle synchronizer 102 may advantageously drive the cycles of the bus interface monitor 104, communications protocol monitor 106, processor model 110, DSP model 112, and the like so that those components need not synchronize cycles with each other. This may eliminate the need to comply with standard protocols and reduce the complexity of integrating and designing individual components and the entire design, reducing costs and time-to-market.

Figure 2:
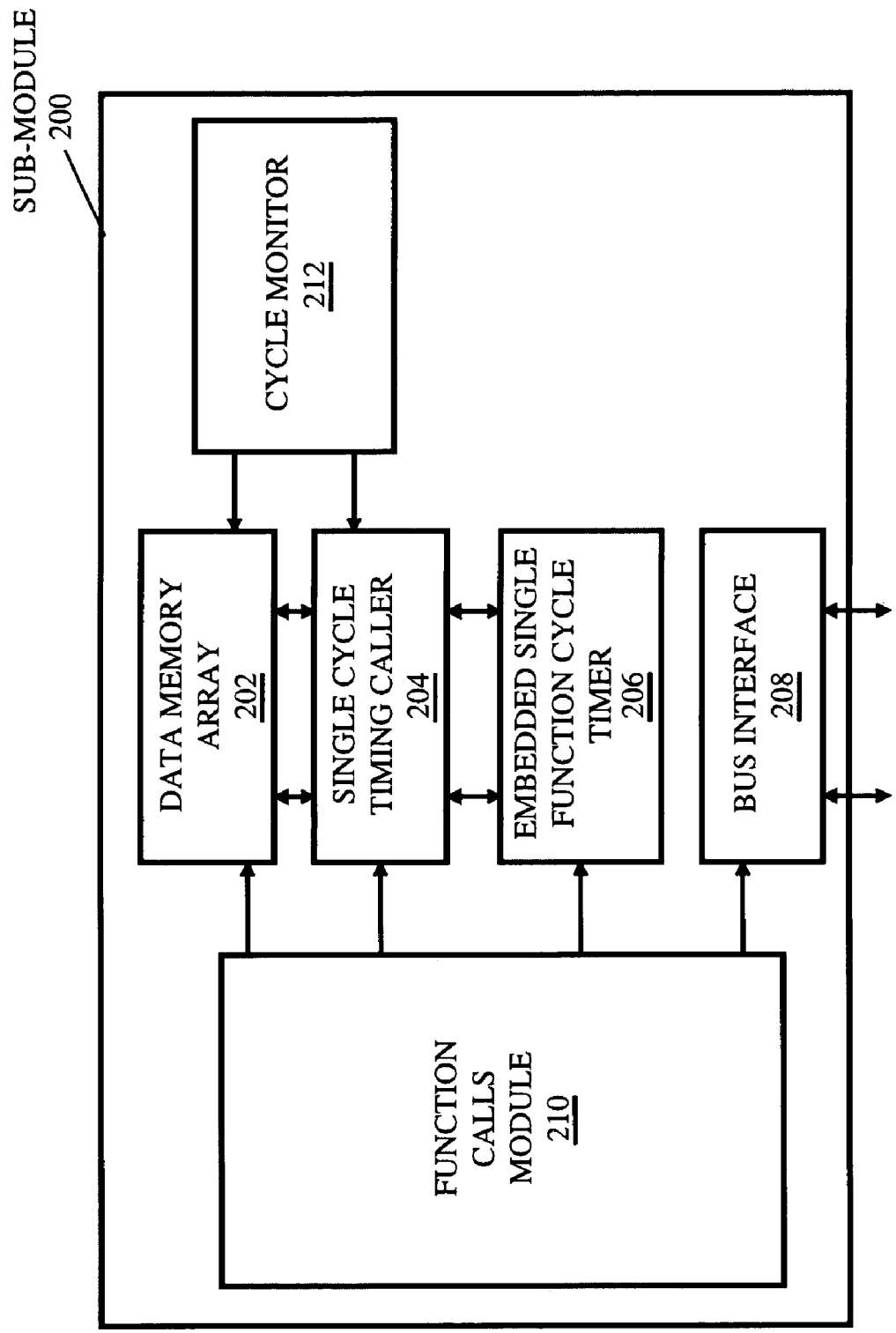
FIG. 2 depicts the structure of a sub-module of the co-simulation system of FIG. 1 according to one embodiment.

FIG. 2 depicts the structure of a sub-module of the co-simulation system of FIG. 1 according to one embodiment. Sub-module 200 may represent a software implementation of any of the software or hardware components of the co-simulation system 100, such as the bus interface monitor 104, the communication protocol monitor 106, the processor model 110, or the DSP model 112. Any protocol, checker or other component may be represented by sub-module 200. In the depicted embodiment, sub-module 200 may include a data memory array (DMA) 202, a single cycle timing caller 204, an embedded single function cycle timer 206, a bus interface 208, a function calls module 210, and a cycle monitor 212. Sub-module 200 may be written in C++ or any other computer language or combination of languages.

The DMA 202 of a sub-module 200 may store information in its structure for use by other components, such as the function calls module 210. The function calls module 210 may handle function calls as part of the simulation. Function calls may include operations performed by the sub-module 200. For example, if sub-module 200 represented a processor model 110 of the co-simulation system 100 the function calls may include various operations performed by a processor. The bus interface 208 of the sub-module 200 may facilitate the simulation of transmission and receipt of information to and from the bus.

The single cycle timing caller 204 of the sub-module 200 may be in communication with the cycle synchronizer 102 of the co-simulation system 100. The cycle synchronizer 102 may call the single cycle timing caller 204 each cycle to instruct the single cycle timing caller 204 to begin a new cycle. Alternatively, the single cycle timing caller 204 may initiate communication with the cycle synchronizer 102 to determine when to begin a new cycle. In one embodiment, the single cycle timing caller 204 is called only once per cycle and in the falling edge of every cycle. Other timing configurations are possible. Once it receives an indication that a new cycle should begin, the single cycle timing caller 204 may call the embedded single function cycle timer 206. The embedded single function cycle timer 206 may be the single cycle timer or clock for a particular hardware model or software code.

By utilizing the system of the disclosed embodiments, the sub-module 200 need only interface with a central cycle synchronizer 102 to synchronize its cycles with other sub-modules 200 or components. Synchronizing cycles with a cycle synchronizer 102 obviates the need to synchronize cycles with other components. In this way, the sub-module need not comply with standard protocols with complicated communication mechanisms in order to communicate with other hardware or software components. This may drastically reduce the design complexity and make the design smaller and simpler to implement. Eliminating the need to go through standard protocols also may increase the speed of information access. The system of the disclosed embodiments may therefore reduce the design time and co-simulation time for an embedded electronic system.

Figure 3:
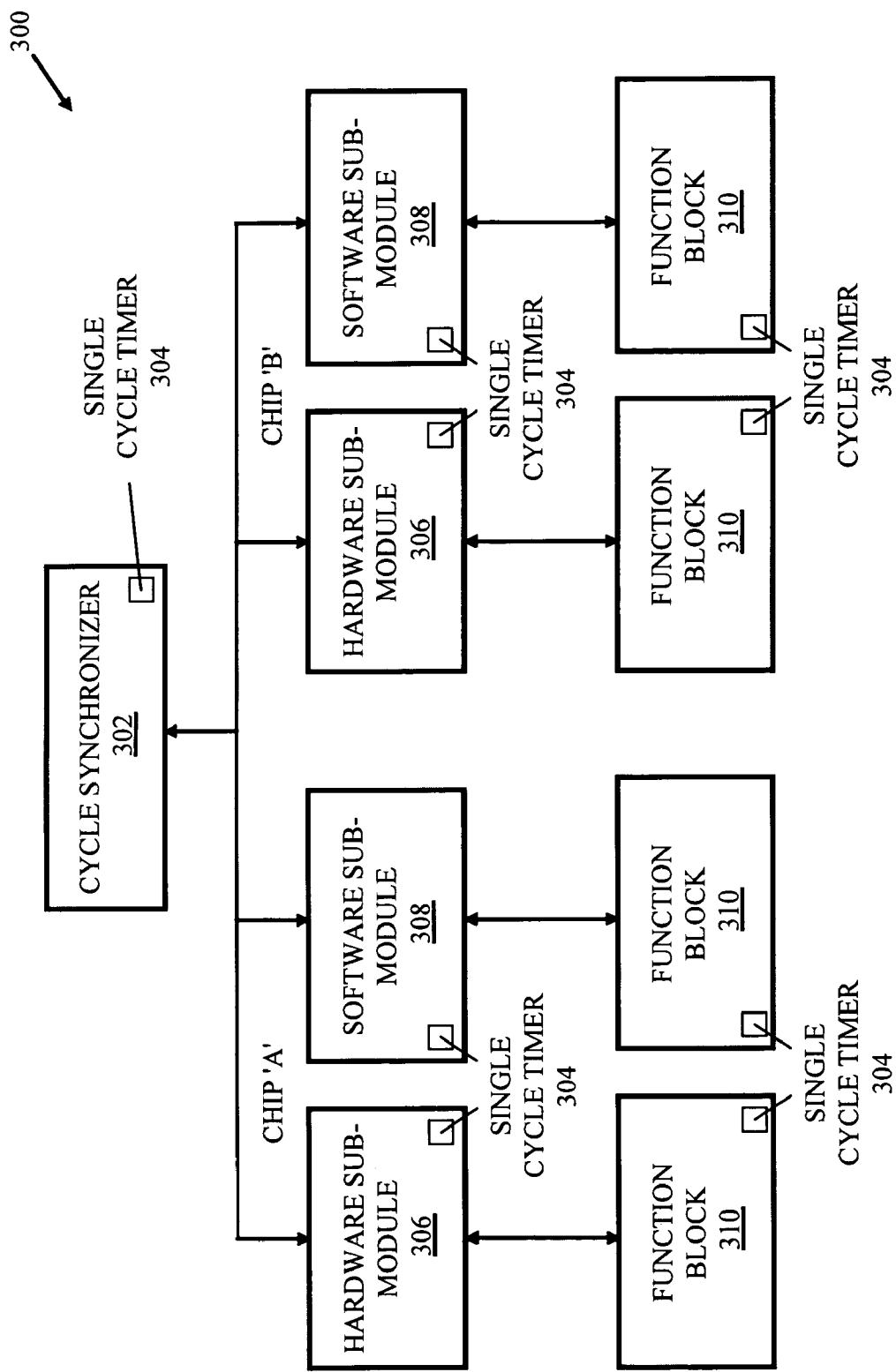
FIG. 3 depicts a schematic hierarchy of cycle timing synchronization including the cycle synchronizer and hardware and software sub-modules according to one embodiment.

FIG. 3 depicts a schematic hierarchy of cycle timing synchronization including the cycle synchronizer and hardware and software sub-modules according to one embodiment. In the depicted embodiment, the cycle timer hierarchy 300 may include a cycle synchronizer 302 at the top of the hierarchy. The cycle synchronizer 302 (which may be the same as cycle synchronizer 102 of FIG. 1) may include a single cycle timer 304 for providing a current cycle time. The single cycle timer 304 of the cycle synchronizer 302 may serve as the 'root' or primary timer of the cycle timer hierarchy 300 and effectively drive the cycles of cycle timers lower in the hierarchy.

Beneath the cycle synchronizer 302, the cycle timer hierarchy 300 may include one or more hardware sub-modules 306 and one or more software sub-modules 308, each of which may contain their own single cycle timer 304. The hardware sub-modules 306 and/or software sub-modules 308 may be the same as sub-module 200 of FIG. 2. The single cycle timer 304 of each hardware sub-module 306 and software sub-module 308 may be called by the single cycle timer 304 of the cycle synchronizer 302 higher in the cycle timer hierarchy 300. In one embodiment, the single cycle timer 304 of cycle synchronizer 302 may call the lower-level single cycle timers 304 always and only once in the falling edge of every cycle.

Beneath the hardware sub-modules 306 and/or software sub-modules 308, the cycle timer hierarchy 300 may include one or more function blocks 310, each of which may contain its own single cycle timer 304. Function blocks 310 may represent software or hardware modular components used to build an integrated hardware and software design. The single cycle timer 304 of a particular function block 310 may call its associated sub-module's single cycle timer 304 every cycle. In one embodiment, the function block 310 single cycle timer 304 may call the higher-level single cycle timer 304 once in the falling edge of every cycle.

Each sub-module and/or function block in this embodiment need only interface and synchronize with the single cycle timer 304 of the cycle synchronizer 302 instead of having to synchronize with each other. A single cycle timer 304 of a hardware sub-module 306, for example, need not synchronize with the single cycle timer 304 of a software sub-module 308 or other hardware sub-modules 306. By only interfacing with the top-level cycle synchronizer 302, complicated protocols and interface issues between different sub-modules and/or function blocks may advantageously be avoided. The advantage may even be larger when interfaces between hardware sub-modules 306 and software sub-modules 308 may be avoided.

The cycle timer hierarchy 300 of FIG. 3 schematically illustrates a multi-chip integrated electronic system (entitled chip 'A' and chip 'B' in the depicted example). The cycle synchronizer 302 may synchronize the hardware and software components of multiple chips in the same fashion as within a single chip. This may provide additional advantages in eliminating the necessity of, for example, the hardware sub-module 306 of chip 'A' having to synchronize directly with the software sub-module 308 of chip 'B'. This may significantly reduce design complexity as handling communications and protocols between chips during design may be particularly problematic.

Figure 4:
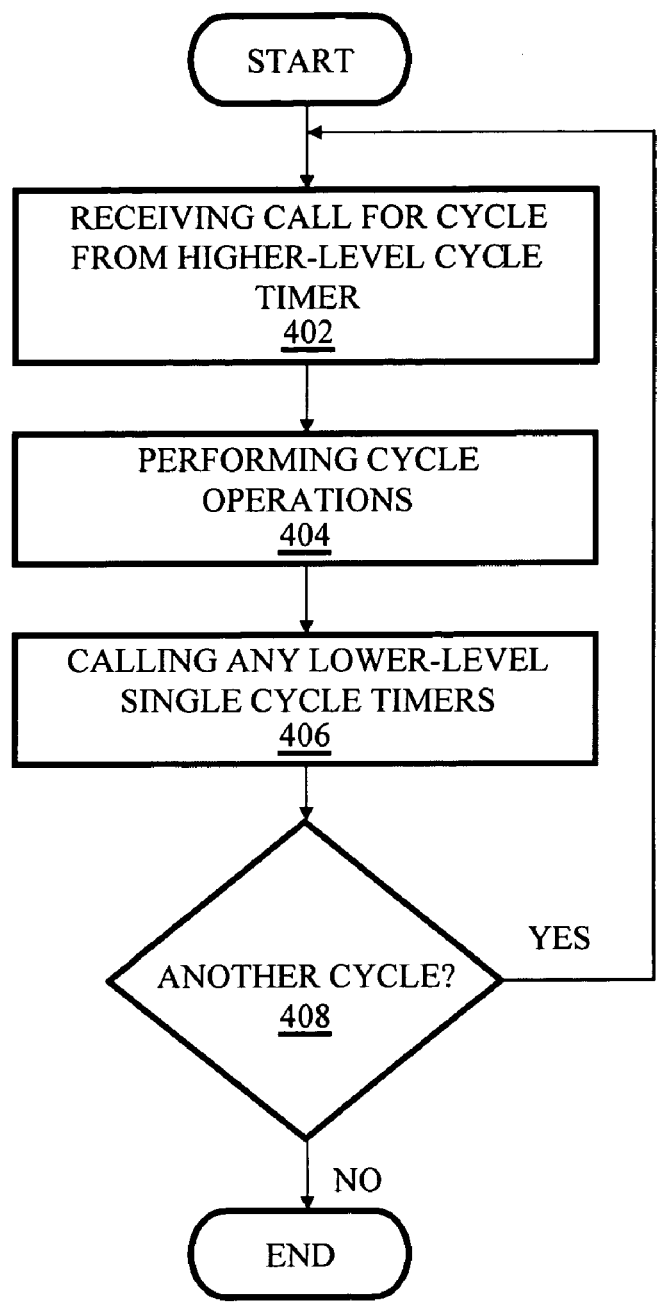
FIG. 4 depicts an example of a flow chart for synchronizing the cycle timers of an integrated hardware and software design according to one embodiment.

FIG. 4 depicts an example of a flow chart for synchronizing the cycle timers of an integrated hardware and software design according to one embodiment. The method of flow chart 400 may be performed, in one embodiment, by any components of the co-simulation system 100, such as sub-modules 200 or function blocks 310. Flow chart 400 begins with element 402, receiving a call for a cycle from a higher-level cycle timer. For example, a sub-module (such as a bus interface monitor 104) may receive a call for a cycle from a cycle synchronizer 102, 302. In another example, a function block 310 may receive a call from a cycle from a sub-module.

After receiving the call for a cycle, the method of flow chart 400 continues to element 404, performing any cycle operations. In this element, the component of the co-simulation system 100 may perform its designated task for that cycle as it would typically do. A processor model 110, for example, may simulate operations associated with that cycle while a bus interface monitor 104 may, in another example, may monitor the traffic on the bus for the simulation cycle. After perform any operations at element 404, the method of flow chart 400 may continue to element 406, calling any lower-level single cycle timers. At optional element 406, the component may call the single cycle timers of any component that is lower in the hierarchy than the component performing flow chart 400. In one example, a software sub-module 308 of FIG. 3 may call the single cycle timer 304 of a function block 310 beneath it in the cycle timer hierarchy 300.

The method of flow chart 400 may then continue to decision block 408, where it is determined whether another cycle is to be performed. If there will be another cycle, the method returns to element 402. If there will not be another cycle (the current cycle is the last cycle of a simulation), the method terminates.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

It will be apparent to those skilled in the art having the benefit of this disclosure that the present invention contemplates methods, systems, and media for simulation of integrated hardware and software. It is understood that the form of the invention shown and described in the detailed description and the drawings are to be taken merely as examples. It is intended that the following claims be interpreted broadly to embrace all the variations of the example embodiments disclosed.

What is claimed is:

1. A co-simulation system for simulating an integrated design implemented on a data processing system having a machine-accessible medium storing a plurality of program modules, the system comprising:

a processor;

a memory coupled to said processor;

one or more software components stored on the machine-accessible medium and exucuted by the processor to simulate software of the integrated design, the one or more software components each having a single cycle timer and an associated single cycle timing caller to receive requests exclusively from a cycle synchronizer to instruct its associated single cycle timer to begin a new cycle;

one or more software function blocks included in each of the one or more software components, each software function block having a single cycle timer and an associated single cycle timing caller to receive requests exclusively from a cycle synchronizer to instruct its associated single cycle timer to begin a new cycle;

one or more hardware components stored on the machine-accessible medium to simulate hardware models of the integrated design, the one or more hardware components each having a single cycle timer and an associated single cycle timing caller to receive requests exclusively from a cycle synchronizer to instruct its associated single cycle timer to begin a new cycle;

one or more hardware function blocks included in each of the one or more hardware components, each hardware function block having a single cycle timer and an associated single cycle timing caller to receive requests exclusively from a cycle synchronizer to instruct its associated single cycle timer to begin a new cycle; and a cycle synchronizer stored on the machine-accessible medium and in direct communication with each of the one or more software components the software function blocks of each software component, the one or more hardware components, and the hardware function blocks of each hardware component, the cycle synchronizer being adapted to generate cycles used to simulate clock cycles of the co-simulation system and to call once per generated cycle the single cycle timers of each of the one or more software components, the software function blocks of each software component, the one or more hardware components, and the hardware function blocks of each hardware component.

2. The system of claim 1, further comprising a memory model stored on the machine-accessible medium.

3. The system of claim 1, further comprising a cycle monitor stored on the machine-accessible medium.

4. The system of claim 1, further comprising a cycle checker stored on the machine-accessible medium.

5. The system of claim 1, wherein one or more of the software components is a bus interface monitor.

6. The system of claim 1, wherein one or more of the software components is a communication protocol monitor.

7. The system of claim 1, wherein one or more of the software components comprises one or more function blocks.

8. The system of claim 1, wherein one or more of the hardware components is a processor model.

9. The system of claim 1, wherein one or more of the hardware components is a Digital Signal Processor (DSP) model.

10. The system of claim 1, wherein one or more of the hardware components comprises one or more function blocks.

11. The system of claim 1, wherein the cycle synchronizer is further adapted to call the single cycle timers of the components on the falling edge of each generated cycle.

12. The system of claim 1, wherein the cycle synchronizer comprises a single cycle timer to generate cycles.

13. A machine-accessible medium containing instructions effective, when executing in a data processing system, to cause said data processing system to perform operations comprising:

performing by a cycle synchronizer of the co-simulation system a clock cycle;

during the clock cycle, calling by the cycle synchronizer a clock cycle of a single cycle timer in a plurality of hardware components;

during the clock cycle, calling by the cycle synchronizer a clock cycle of a single cycle timer in one or more hardware function blocks of each of the plurality of hardware components;

during the clock cycle, calling by the cycle synchronizer a clock cycle of a single cycle timer in a plurality of software components during the clock cycle, calling by the cycle synchronizer a clock cycle of a single cycle timer in one or more software function blocks of each of the plurality of software components;

in response to receiving a call for a clock cycle from the cycle synchronizer, calling a clock cycle for single function cycle timers embedded in each of the hardware components, hardware function blocks, software components, and software function blocks to synchronize the components and function blocks with the cycle synchronizer; and during the cycle called by the embedded single function cycle timers, performing operations relating to the called cycle of the cycle synchronizer single cycle timer by each of the hardware components, hardware function blocks, software components, and software function blocks.

14. The machine-accessible medium of claim 13, wherein calling the clock cycle of the single cycle timer comprises calling the clock cycle in the falling edge of the clock cycle of the cycle synchronizer.

* * * * *